(12) United States Patent
Kobayashi et al.

(10) Patent No.: US 7,974,525 B2
(45) Date of Patent: Jul. 5, 2011

(54) HEAT PROCESSING FURNACE AND VERTICAL-TYPE HEAT PROCESSING APPARATUS

(75) Inventors: Makoto Kobayashi, Nirasaki (JP); Takashi Ichikawa, Nirasaki (JP); Kenichi Yamaga, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 675 days.

(21) Appl. No.: 12/071,909

(22) Filed: Feb. 27, 2008

(65) Prior Publication Data
US 2008/0205864 A1 Aug. 28, 2008

(30) Foreign Application Priority Data
Feb. 28, 2007 (JP) .................................. 2007-049785

(51) Int. Cl.
*A21B 2/00* (2006.01)
*F26B 19/00* (2006.01)

(52) U.S. Cl. ........ 392/416; 392/407; 219/402; 219/403; 219/406; 219/408

(58) Field of Classification Search .................. 392/407, 392/416; 219/402, 403, 406, 408
See application file for complete search history.

(56) References Cited

U.S. PATENT DOCUMENTS

| | | | | |
|---|---|---|---|---|
| 2,035,306 A | * | 3/1936 | Fannin | 373/130 |
| 3,786,162 A | * | 1/1974 | Colson | 373/119 |
| 5,095,192 A | * | 3/1992 | McEntire et al. | 219/402 |
| 5,536,919 A | * | 7/1996 | Taheri | 219/402 |
| 6,125,134 A | * | 9/2000 | Jonsson et al. | 373/128 |
| 7,564,007 B2 | * | 7/2009 | Bailey | 219/403 |
| 7,595,465 B2 | * | 9/2009 | Kolk | 219/402 |

FOREIGN PATENT DOCUMENTS

| | | |
|---|---|---|
| JP | 10-233277 | 9/1998 |
| JP | 2002-164298 A | 6/2002 |
| JP | 2004-39967 | 2/2004 |

OTHER PUBLICATIONS

Chinese Office Action issued on May 21, 2010 for Application No. 200810088177.6 with English translation.
Chinese Office Action received in CN 200810088177.6, Mailed Nov. 9, 2010 and English translation.

* cited by examiner

*Primary Examiner* — Thor S Campbell
(74) *Attorney, Agent, or Firm* — Smith, Gambrell & Russell, LLP

(57) ABSTRACT

The present invention is a heat processing furnace comprising: a processing vessel for accommodating an object to be processed and performing thereto a heat process; and a cylindrical heater disposed to surround a circumference of the processing vessel, for heating the object to be processed; wherein: the heater includes a cylindrical heat insulating member, ribbed shelf sections that are axially formed in a tier-like manner on an inner circumference of the heat insulating member, and heating resistance wires of a helical pattern that are placed along the respective shelf sections; and pin members are arranged in the heat insulating member at suitable intervals therebetween, the pin members holding the heating resistance wires such that the heating resistance wires are movable in a radial direction of the heater, while preventing dropout of the heating resistance wires from the shelf sections.

6 Claims, 6 Drawing Sheets

HEAT PROCESSING FURNACE AND VERTICAL-TYPE HEAT PROCESSING APPARATUS

TECHNICAL FIELD

The present invention relates to a heat processing furnace and a vertical-type heat processing apparatus including the heat processing furnace.

BACKGROUND ART

When a semiconductor device is manufactured, various heat processing apparatuses are used for subjecting a semiconductor wafer, which is an object to be processed, to processes such as an oxidation process, a diffusion process, and a CVD (Chemical Vapor Deposition) process. A general heat processing apparatus includes a heat processing furnace which is mainly composed of: a processing vessel (reaction tube) capable of accommodating semiconductor wafers and heat-processing the same; and a heater (heating device) that is disposed to cover a circumference of the processing vessel, for heating wafers in the processing vessel. The heater is mainly composed of a cylindrical heat insulating member, and a heating resistor disposed on an inner circumference of the heat insulating member via a supporting member.

In a heat processing apparatus capable of performing a batch process, for example, there is used, as the heating resistor, a helical heating wire (heating resistance wire) arranged along an inner wall surface of the cylindrical heat insulating member. The heating wire can heat an inside of the furnace to a high temperature such as about 800° C. to 1000° C. As the heat insulating member, there is used a member that is formed by burning a heat insulating material, such as ceramic fibers, into a cylindrical shape. The heat insulating member can reduce a heat quantity lost as radiant heat and conductive heat, so as to enhance efficiency in heating. As the supporting member, there is used a ceramic member, for example. The ceramic supporting member can support the heating wire at predetermined pitches, while allowing heat expansion and heat shrinkage of the heating wire.

In the above heat processing furnace, in order that the heating wire, which is helically formed, can be thermally expanded and thermally shrunk, the heating wire is supported such that a clearance is defined between the heating wire and the heat insulating member. By using the heating wire under a high temperature, the heating wire undergoes a creep strain, and slowly increases in length over time. In addition, the heating wire is thermally expanded during a heating operation. On the other hand, there is an apparatus that quickly cools a heating wire by blowing air thereto so as to decrease a temperature. Due to the repeated rise and drop in temperature, the heating wire is likely to be deformed. This may generate a short-circuit between adjacent parts of the deformed heating wire, which may invite disconnection.

Particularly in a vertical-type heat processing furnace, the heating wire is moved in the supporting member because of the repeated heat expansion and heat shrinkage caused by the rinse and drop in temperature, and the heating wire is moved downward little by little because of gravitation. Then, the moving amount is accumulated at a lowermost turn of the heating wire. Namely, due to the accumulation of the movement of the heating wire, a winding diameter of the lowermost turn is increased. When the heating wire of the increased winding diameter reaches an inner surface of the heat insulating member and cannot be expanded outside any more, the heating wire is then deformed in the up and down direction. Thus, there is a possibility that a short-circuit occurs between a part and another part adjacent thereto of the heating wire, resulting in some disconnection.

In order to eliminate these problems, the following structure has been proposed (see, JP10-233277A). Namely, in order to prevent such an accumulation to one side of the elongated heating wire caused by creep and thermal expansion or the like, a fixing member of a rod-like shape is attached to an outside portion of the heating wire by welding, and a distal end of the fixing member is buried to be fixed in a heat insulating member, so that the fixing member projects outward in a radial direction of the furnace.

However, in the above structure in which the fixing member is merely joined to the outside portion of the heating wire by welding, the joined portion is exposed to a high temperature. In addition, it can be considered that a stress tends to concentrate on the joined portion when the heating resistor is thermally expanded or thermally shrunk, which entails deterioration in durability (reduction in lifetime) of the heating wire. Further, since the fixing member has a bar-like shape, the fixing member may easily drop out of the heat insulating member, whereby it is difficult to secure a sufficient holding force for the fixing member.

Moreover, when it is desired to quickly increase or decrease the temperature of a wafer, a large power has to be applied to a heating wire during the quick temperature-increasing operation. However, a conventional, general heating wire may not withstand the large load, and may be prone to be disconnected. For this reason, such a large power cannot be actually applied, and thus the quick temperature increase/decrease operation is limited. Although the use of a heating wire resistant to disconnection can overcome the difficulty, this incurs increase in cost because such a heating wire is expensive.

Meanwhile, in order to make longer the lifetime (to improve the durability) of the heating wire by reducing a load applied thereto, it is effective to increase a ratio of a surface area of the heating wire (element surface area) relative to a supplied power. This is because, when the heating wire surface area is increased, a surface temperature of the heating wire is lowered, to thereby reduce a load of the heating wire. Since a so-called spiral (helical)-type heating wire is suitable as a design for load reduction and can be efficiently arranged in a desired space, such a heating wire is widely used.

However, as shown in FIG. 9, for example, a heater or a heat processing furnace using a spiral-type heating wire conventionally employs a structure in which a heating wire 18 is buried in a heat insulating member 16 so as to fix the heating wire 18. Thus, an object to be heated in a reactor core is heated via the heat insulating member 16, so that it is difficult to quickly increase a temperature of the object. It is also difficult to quickly decrease the temperature of the object, because the heating wire 18 is cooled via the heat insulating member 16, in addition to an effect of increase in heat capacity caused by the heat insulating member 16. Moreover, since there is no clearance for allowing expansion of the heating wire 18, the heating wire 18 itself is stressed when it is expanded. Thus, durability of the heating wire may be not sufficient.

SUMMARY OF THE INVENTION

The present invention has been made in order to solve the above problems. The object of the present invention is to provide a heat processing furnace and a vertical-type heat processing apparatus that are capable of quickly increasing and decreasing a temperature, while achieving improvement in durability and reduction in cost.

The present invention is a heat processing furnace comprising: a processing vessel for accommodating an object to be processed and performing thereto a heat process; and a cylindrical heater disposed to surround a circumference of the processing vessel, for heating the object to be processed; wherein: the heater includes a cylindrical heat insulating member, ribbed shelf sections that are axially formed in a tier-like manner on an inner circumference of the heat insulating member, and heating resistance wires of a helical pattern that are placed along the respective shelf sections; and pin members are arranged in the heat insulating member at suitable intervals therebetween, the pin members holding the heating resistance wires such that the heating resistance wires are movable in a radial direction of the heater, while preventing dropout of the heating resistance wires from the shelf sections.

Alternatively, the present invention is a vertical-type heat processing apparatus comprising: a heat processing furnace including: an elongated processing vessel having a lower part that is opened to define a furnace opening, for accommodating an object to be processed and performing thereto a heat process; and a cylindrical heater disposed to surround a circumference of the processing vessel, for heating the object to be processed; a lid member for closing the furnace opening; and an elevating mechanism that elevates the lid member under a condition wherein a holder holding objects to be processed in a tier-like manner is placed on the lid, and that opens and closes the furnace opening with the lid member so as to load and unload the holder into and from the processing vessel; wherein: the heater includes a cylindrical heat insulating member, ribbed shelf sections that are axially formed in a tier-like manner on an inner circumference of the heat insulating member, and heating resistance wires of a helical pattern that are placed along the respective shelf sections; and pin members are arranged in the heat insulating member at suitable intervals therebetween, the pin members holding the heating resistance wires such that the heating resistance wires are movable in a radial direction of the heater, while preventing dropout of the heating resistance wires from the shelf sections.

According to the above respective inventions, the heating resistance wires of a helical pattern are placed on the respective shelf sections formed on the inner circumference of the heat insulating member. Namely, it is easy to realize placement of the heating resistance wires in an exposed condition, enabling a quick temperature increase/decrease operation. On the other hand, since thermal expansion and thermal shrinkage of the heating resistance wire of a helical pattern are not constricted, excellent durability can be attained. In addition, no additional cost is needed.

For example, each of the pin members has a U-shape in plan view to form a U-shaped portion to hold an outside turning portion of the heating wire, and opposed leg parts of the pin member are passed through the heat insulating member from the inside to the outside, and bent along an outer surface of the heat insulating member.

Alternatively, it is preferred that each of the shelf sections of the heat insulating member is provided with a forcible-cooling-air blowing hole that passes through the shelf section inside and outside.

Alternatively, it is preferable that each of the heating resistance wires is positioned such that an inner periphery of the heat insulating member, which is an opening periphery of the shelf section, and a center of the helical pattern are conformed (aligned) to each other, when viewed in an axial direction of the heater.

BEST MODE FOR CARRYING OUT THE INVENTION

Figure 1:
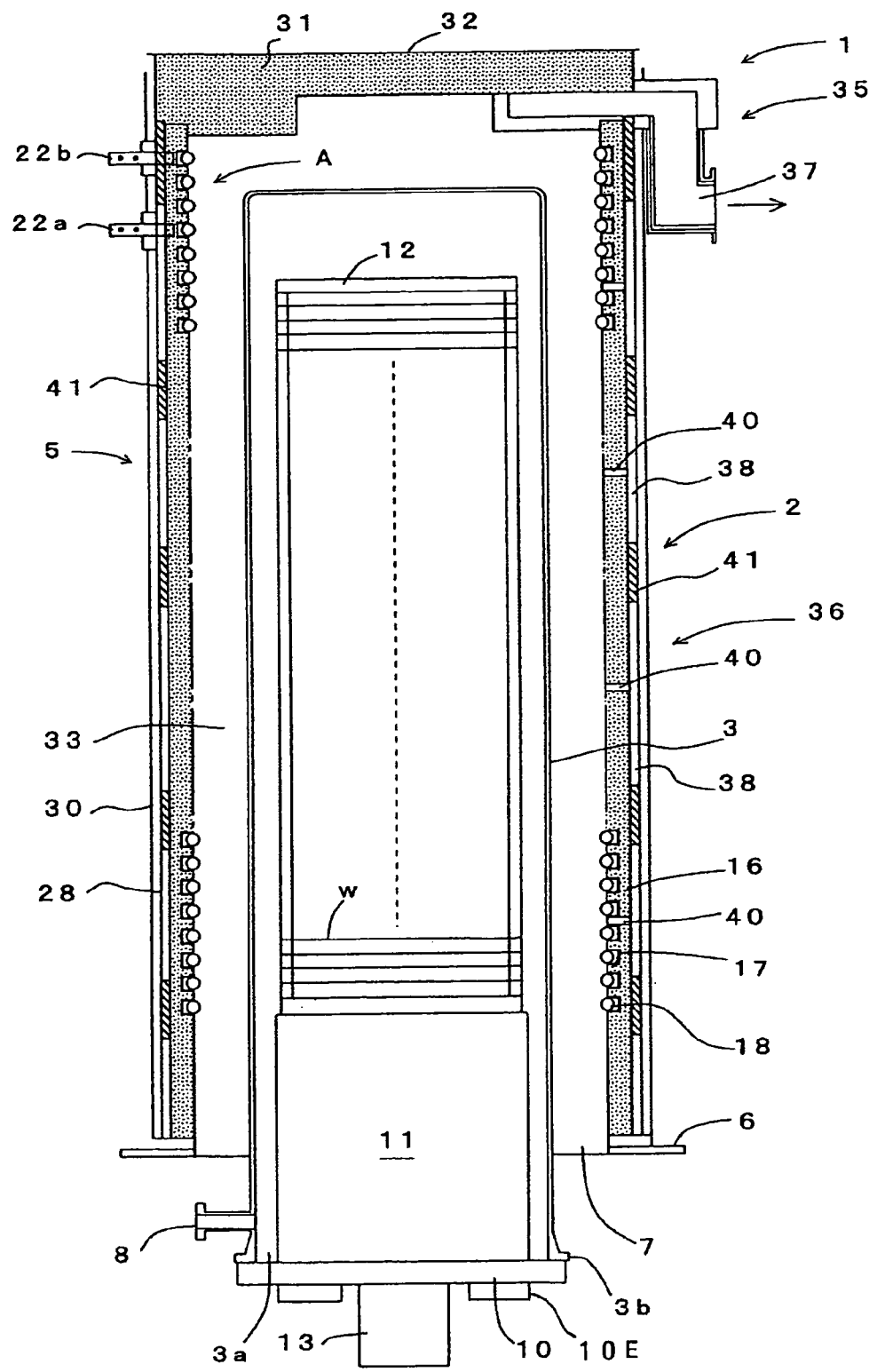
FIG. 1 is a longitudinal sectional view schematically showing a vertical-type heat processing apparatus in one embodiment of the present invention.
Figure 2:
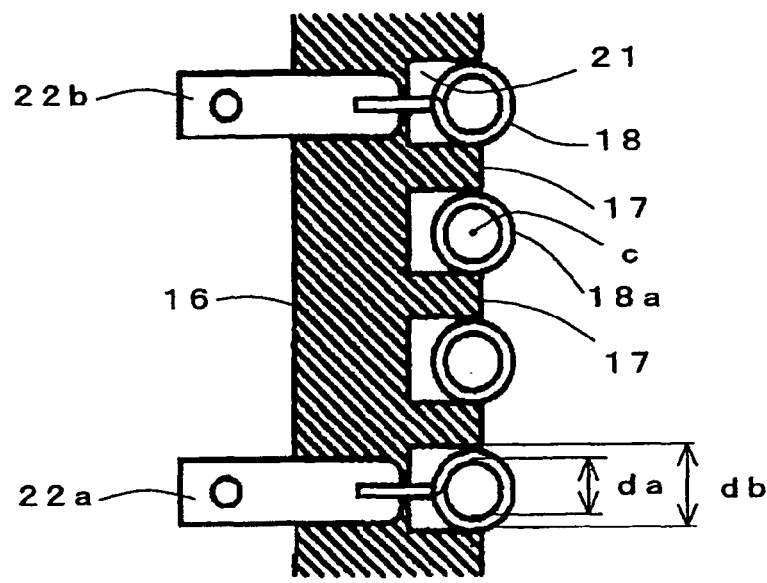
FIG. 2 is an enlarged sectional view showing a part A of FIG. 1.
Figure 3:
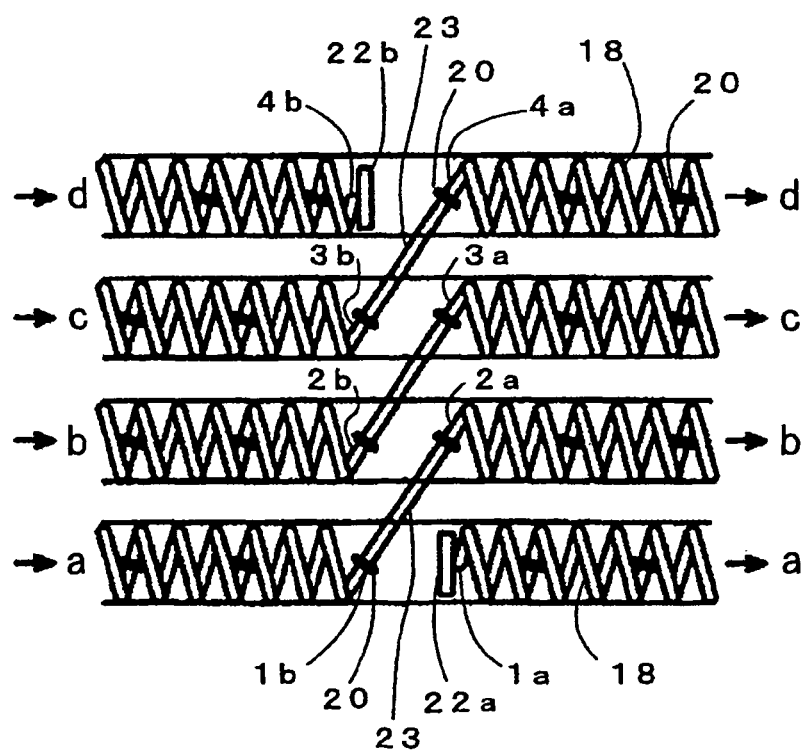
FIG. 3 is a view schematically showing an example of wire connection of heating elements.
Figure 4:
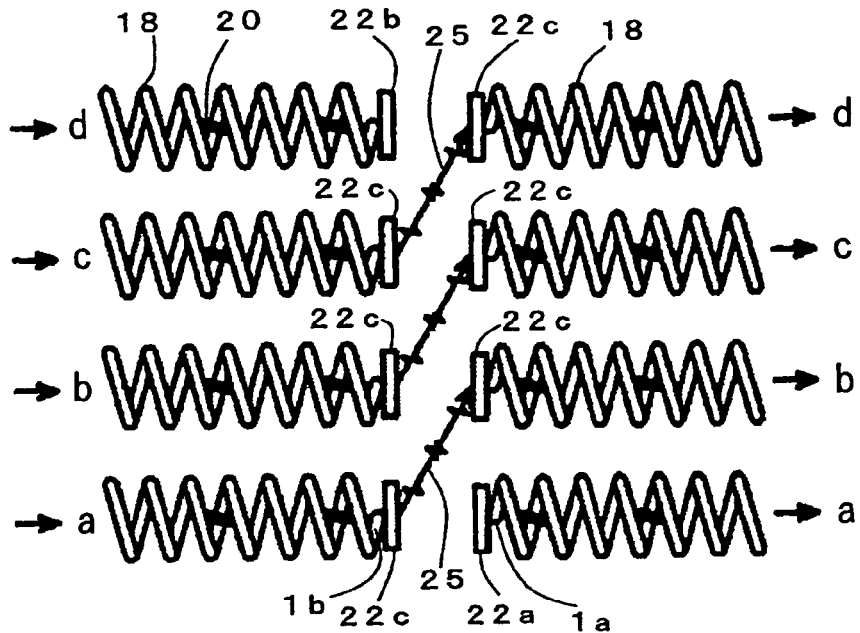
FIG. 4 is a view schematically showing another example of wire connection of the heating elements.
Figure 5:
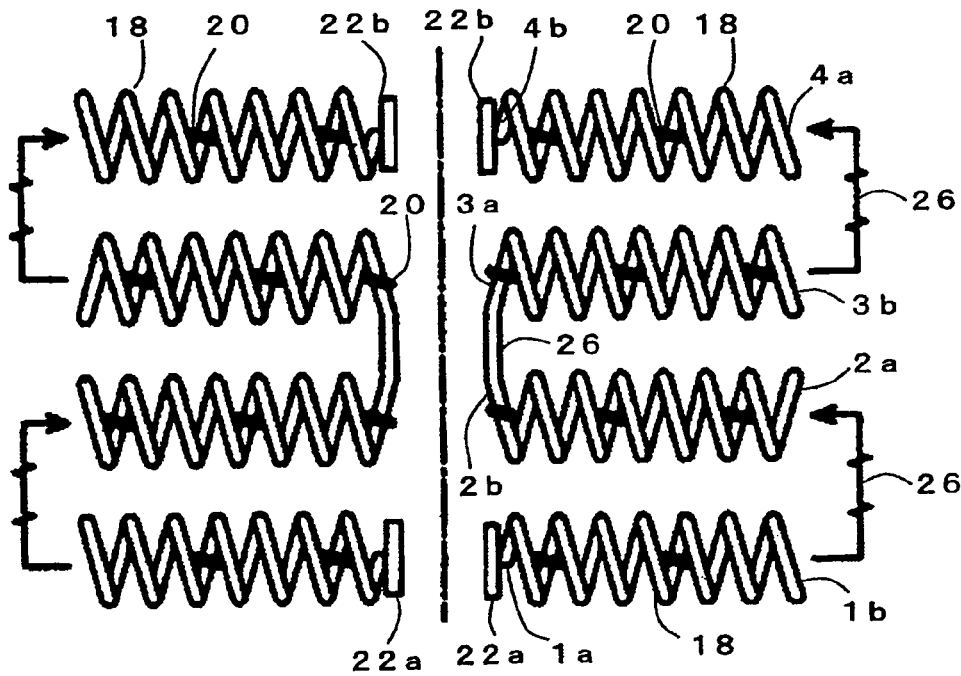
FIG. 5 is a view schematically showing still another example of wire connection of the heating elements.
Figure 6:
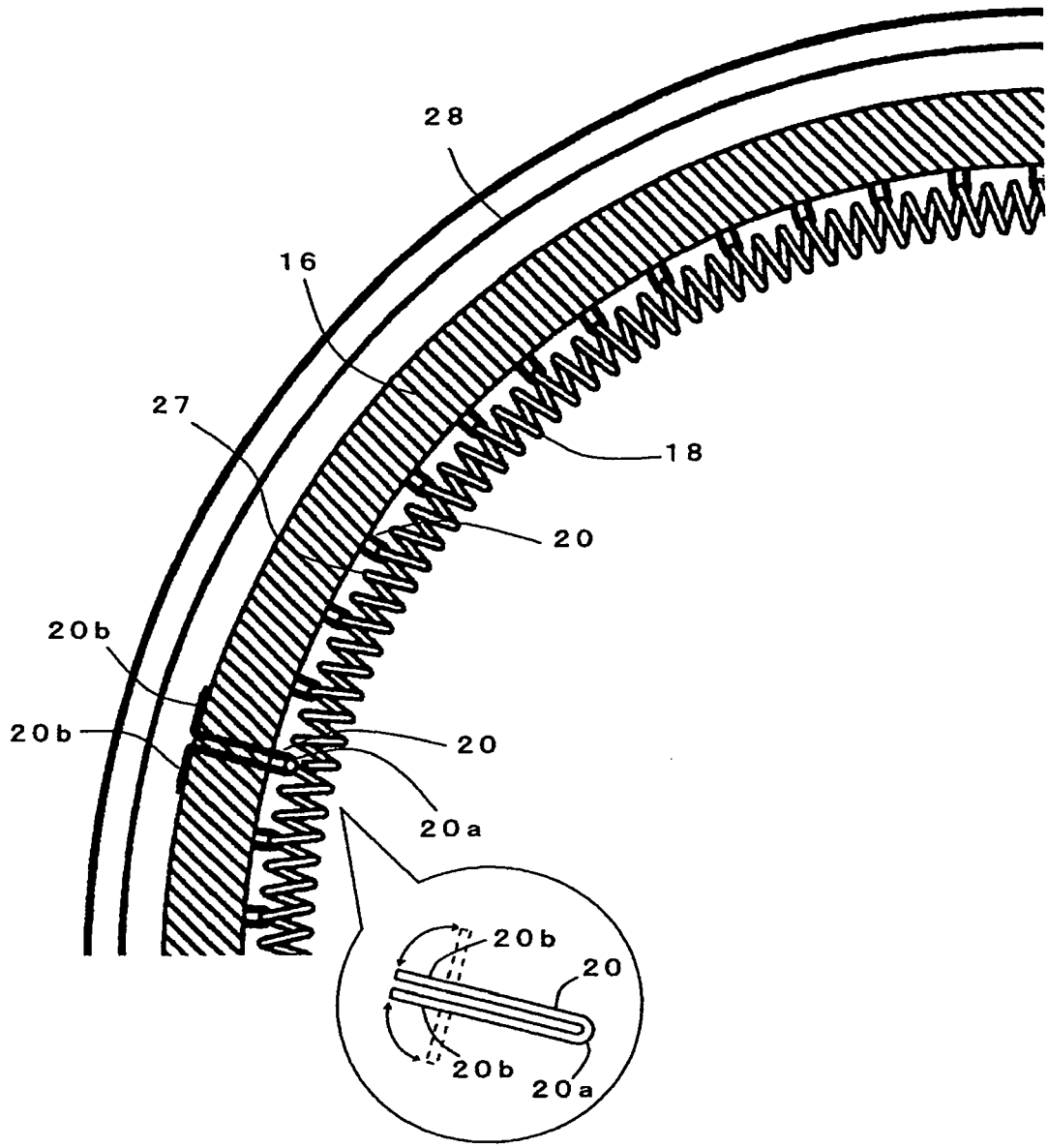
FIG. 6 is a cross-sectional view showing a part of the vertical-type heat processing apparatus.

A best mode for carrying out the present invention will be described in detail below with reference to the attached drawings. FIG. 1 is a longitudinal sectional view schematically showing a vertical-type heat processing apparatus in one embodiment of the present invention. FIG. 2 is an enlarged sectional view showing a part A of FIG. 1. FIG. 3 is a view schematically showing an example of wire connection of heating elements. FIG. 4 is a view schematically showing another example of wire connection of the heating elements. FIG. 5 is a view schematically showing still another example of wire connection of the heating elements. FIG. 6 is a cross-sectional view showing a part of the vertical-type heat processing apparatus.

FIG. 1 shows a vertical-type heat processing apparatus 1 which is a kind of a semiconductor manufacturing apparatus. The heat processing apparatus 1 includes a vertical-type heat processing furnace 2 that can simultaneously accommodate a number of objects to be processed such as semiconductor wafers w, and can perform thereto a heat process such as an oxidation process, a diffusion process, and a reduced-pressure CVD process. The heat processing furnace 2 includes: a processing vessel (also referred to as "reaction tube") 3 for accommodating wafers w and performing thereto a heat process; and a cylindrical heater (heating device) 5 disposed to surround a circumference of the processing vessel 3, for heating the wafers w.

The heat processing apparatus 1 also includes a base plate 6 on which the heater 5 is installed. The base plate 6 is provided with an opening 7 through which the processing vessel 3 is inserted upward from below. The opening 7 is equipped with a heat insulating member, not shown, which blocks a gap between the base plate 6 and the processing vessel 3.

The processing vessel 3 is made of quartz, and is formed into an elongated cylindrical shape. An upper end of the processing vessel 3 is closed, while a lower end thereof is opened to define a furnace opening 3a. An outward flange 3b is formed around the opened end of the processing vessel 3.

The flange 3b is supported by the base plate 6 through a flange pressing member, not shown. The illustrated processing vessel 3 is equipped with, in a lower part thereof, an introduction port (inlet) 8 for introducing a process gas and/or an inert gas into the processing vessel 3, and a discharge port (outlet), not shown, for discharging a gas in the processing vessel 3. A gas supply source is connected to the introduction port 8. Connected to the discharge port is an exhaust system having a vacuum pump capable of controlling a pressure in the processing vessel 3 to be reduced to, e.g., 10 Torr to $10^{-8}$ Torr.

Below the processing vessel 3, there is disposed a lid member 10 for closing the lower end opening (furnace opening) 3a of the processing vessel 3. The lid member 10 can be vertically moved by an elevating mechanism 10E. Disposed on an upper part of the lid member 10 is heat retaining means for the furnace opening, such as a heat retaining tube 11. Disposed on an upper part of the heat retaining tube 11 is a quartz boat 12 acting as a holder which is capable of holding a number of, e.g., about 100 to 150 wafers w having a diameter of, e.g., 300 mm, at predetermined vertical intervals therebetween. The lid member 10 is provided with a rotating mechanism 13 that rotates the boat 12 about its shaft center. The boat 12 is unloaded from the processing vessel 3 to a lower loading area 15, by the downward movement of the lid member 10. After replacement of wafers w, the boat 12 is loaded into the processing vessel 3, by the upward movement of the lid member 10.

As shown in FIGS. 2 to 6, the heater 5 includes: a cylindrical heat insulating member 16; a plurality of ribbed shelf sections 17 that are axially (vertically in the drawings) formed in a tier-like manner on an inner circumference of the heat insulating member 16; and heating wires (heating resistance wires) 18 of a spiral type (helical pattern) that are placed along the respective shelf sections 17. The heat insulating member 16 is formed of inorganic fibers containing silica, alumina, or aluminum silicate, for example.

Pin members 20 are arranged in the heat insulating member 16 at suitable intervals therebetween. The pin members 20 hold the heating wires 18 in such a manner that the heating wires 18 are movable in a radial direction of the heater 5, while dropout and escape of the heating wires 18 from the shelf sections 17 are prevented. A plurality of grooves 121 of (adjacent to) the shelf sections 17 are formed in a tier-like manner on the inner circumference of the heat insulating member 16 at predetermined axial pitches or at suitable axial intervals. Each of the grooves 21 are annular and concentric with the cylindrical heat insulating member 16 preferably has a rectangular cross-section, and preferably has such a groove width and a groove length that the groove 21 can loosely receive the heating wire 18. Namely, it is preferable that the groove 21 has a sufficient clearance for allowing (absorbing) thermal expansion and thermal shrinkage of the heating wire 18 both in the vertical direction and the radial direction.

The heating wire 18 is formed of an alloy wire (so-called kanthal wire) containing, for example, iron (Fe), chrome (Cr), and aluminium (Al). The heating wire 18 is, e.g., 3 mm in thickness (diameter). An internal diameter da of a spiral portion 18a is, e.g., 10 mm, and an external diameter db thereof is, e.g., 16 mm. It was found that, from the aspect of improving a temperature increase/decrease speed, the heating wire 18 is preferably positioned or held such that an inner circumferential periphery of the heat insulating member, which is an opening periphery of the groove 21 of the shelf section 17, and a center c of the spiral portion 18a (center of the helical pattern) are conformed (aligned) to each other, when viewed from the axial direction of the heater 5.

As shown in FIGS. 2 and 3, different from a conventional heating wire which helically and vertically extends in a continuous manner, the heating wire 18 is terminated at each step, and is positioned on each shelf section 17 serving as the step. Thus, it can be prevented that the heating wire 18 is moved downward by its own weight and accumulated. Further, the heating wires 18 are serially connected among every plural steps (four steps in the drawings) between the adjacent upper and lower steps (see, FIG. 3). Furthermore, terminal plates 22a and 22b to be connected to electrodes are respectively connected to a start end 1a of the lowermost step and a dead end 4b of the uppermost step, for each group including four steps. Thus, the heater 5 is vertically divided into a plurality of zones in the heat processing furnace 2. A temperature of each zone can be independently controlled.

FIGS. 3 to 5 respectively show, by way of example, possible wire connection patterns of the heating wires 18.

In the wire connection pattern of the heating wires as shown in FIG. 3, a dead end 1b of a first step (lowermost step) and a start end 2a of a second step are connected to each other by a wire connecting portion 23. Similarly, dead ends 2b and 3b of lower steps and start ends 3a and 4a of upper steps (next steps) are respectively connected to each other. A portion connecting the steps (wire connecting portion 23) may be formed by forcibly extending one of the spiral portions 18a of the heating wires 18, when the heating wires 18 are placed on the respective shelf sections 17. In the wire connection pattern of the heating wires 18 shown in FIG. 3, the wire connecting portion 23 is arranged inside the heat insulating member.

On the other hand, in the wire connection pattern of the heating wires 18 shown in FIG. 4, a wire connecting portion 24 is arranged outside the heat insulating member. Specifically, terminal plates 22c and 22c are respectively connected to a dead end 1b of a first step and a start end 2a of a second step, and these terminal plates 22c and 22c are electrically connected to each other by a wire connecting portion such as an electric cable 25, outside the heat insulating member. Similarly, dead ends 2b and 3b of lower steps and start ends 3a and 4a of upper steps (next steps) are respectively connected to each other, outside the heat insulating member.

The wire connection pattern of the heating wires 18 shown in FIG. 5 is suitable for a case in which, as shown in FIG. 7, the cylindrical heat insulating member is halved, i.e., longitudinally divided into two. In this case, the heating wire 18 is also divided into two, corresponding to the halved heat insulating members 16. The heating wires 18 in each of the two longitudinally divided areas are connected such that terminal plates 22a and 22b are respectively connected to an end of a lowermost step and an end of an uppermost step, and that dead ends 1b, 2b, and 3b of lower steps and start ends 2a, 3a, and 4a of the upper steps are sequentially connected to each other by wire connecting portions 26 (the wire connecting portion 26 may be positioned inside or outside the heat insulating member).

The wire connection pattern of the heating wires 18 is not limited to the above examples.

In view of preventing fusion of the terminal plates and restraining heat release therefrom, the terminal plates 22a, 22b, and 22c are formed into a plate-like shape having a predetermined cross-sectional area, by using the same material as that of the heating wire 18. A portion of the heating wire 18 to which a terminal plate is connected, that is, a start end or a dead end of the heating wire 18, is previously extended radially outward, and a terminal plate is joined thereto by welding. Generally, one end of each of the terminal plates 22a, 22b, and 22c is embedded in the heat insulating member, and the other end thereof is projected radially outward from an outer surface of the heat insulating member.

As shown in FIG. 6, it is preferable the pin member 20 has a U-shape in plan view to form a U-shaped portion 20a to hold an outside turning portion 27 of the heating wire 18. It is also preferable that opposed leg parts 20a and 20b of the pin member 20 are passed through the heat insulating member 16 from the inside to the outside, and bent along an outer surface of the heat insulating member 16. In this case, the pin member 20 can be easily mounted. In addition, the heating wire 18 is supported so as to be radially movable within a predetermined range, while jumping out or escape of the heating wire 18 in a radially inward direction can be prevented.

In order to maintain the shape of the heat insulating member 16 and to reinforce the heat insulating member 16, as shown in FIG. 1, an outer circumference of the heat insulating member 16 is preferably covered with an outer shell 28 made of metal such as stainless. Moreover, an outer circumference of the outer shell 28 is preferably covered with a water cooling jacket 30, so as to restrain a heat influence of the heater 5 on the outside. In addition thereto, in the example shown in FIG. 1, a top part of the heat insulating member 16 is covered with an upper heat insulating member 31, and further, a stainless top plate 32 covering also a top part (upper end part) of the outer shell 28 is disposed on an upper part of the upper heat insulating member 31.

In order that a temperature of the wafers is quickly lowered so as to accelerate a process or to improve a throughput, the heater 5 is equipped with a heat discharging system 35 for discharging outward an atmosphere in a space 33 between the heater 5 and the processing vessel 3, and a forcible air-cooling unit 36 for forcibly cooling the processing vessel 3 by introducing an air of a normal temperature (20° C. to 30° C.) into the space 33. The heat discharging system 35 is mainly composed of an outlet 37 formed in an upper part of the heater 5, and a heat discharging pipe, not shown, for connecting the outlet 37 and a factory air-discharging system, not shown. The heat discharging pipe is provided with an air-discharging blower and a heat exchanger, not shown.

Figure 7A:
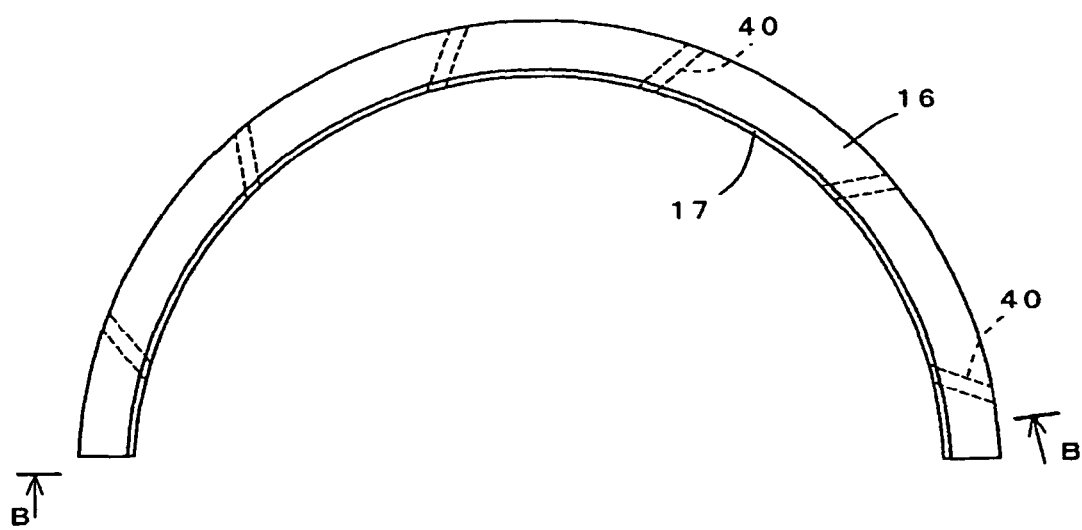
FIG. 7A is a plan view showing an example of a heat insulating member.
Figure 7B:
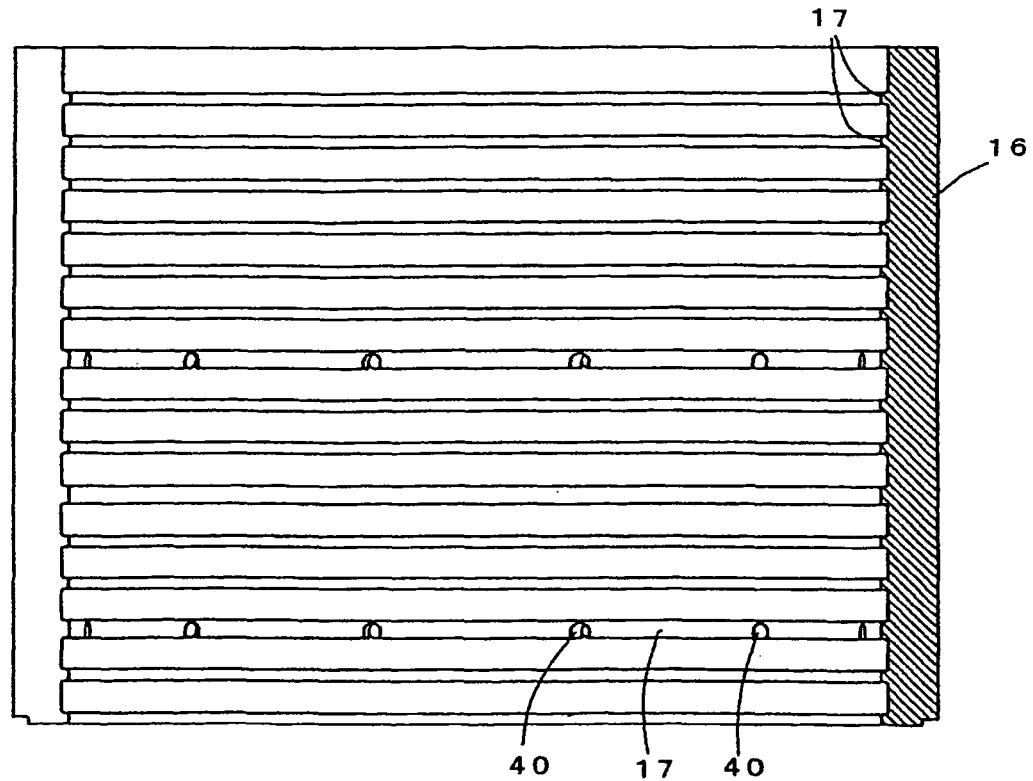
FIG. 7B is a sectional view taken along the line B-B of FIG. 7A.

The forcible air-cooling unit 36 has: a plurality of annular paths 38 that are formed between the heat insulating member 16 and the outer shell 28 in a height direction; and a plurality of horizontal and radially inclined forcible-cooling-air blowing holes 40 that are formed in the heat insulating member 16, through which air is blown from the respective annular paths 38 into an inside of the heat insulating member 16 in the horizontal and radially inclined direction so as to generate whirls in the space 33 in a circumferential direction thereof. Alternatively, the blowing holes 40 may be formed in the heat insulating member 16 in a horizontal and radial (perpendicular) direction so as to directly (rectangularly) apply air (wind) onto the processing vessel 3. Each of the annular paths 38 may be formed by attaching a strip-like or annular heat insulating member 41 to an outer circumference of the heat insulating member 16, or by annularly scraping the outer circumference of the heat insulating member 16. As shown in FIGS. 7A and 7B, the air blowing holes 40 are preferably formed in the heat insulating member 16 so as to pass through the shelf sections 17 of the heat insulting member 16. In this case, the air can be spouted into the space 33 without interference of the heating wires 18.

A common (one) supply duct, not shown, for distributing a cooling fluid into the respective annular paths 38, is arranged on an outer surface of the outer shell 28 along a height direction thereof. The outer shell 28 is provided with communication holes that communicate the supply duct and the respective annular paths 38. To the supply duct, there is connected, via a switching valve, a cooling-fluid supply source (e.g., ventilator), not shown, which sucks air in a clean room as a cooling fluid and pressure-feeds the same.

The heat processing furnace 2 or the vertical-type heat processing apparatus 1 as structured above includes: the processing vessel 3 for accommodating the wafers w and performing thereto a heat process; and the cylindrical heater 5 disposed to surround a circumference of the processing vessel 3, for heating the wafers w. The heater 5 has the cylindrical heat insulating member 16, the ribbed shelf sections 17 axially formed in a tier-like manner on the inner circumference of the heat insulating member 16, and the heating wires 18 of a spiral type that are placed along the respective shelf sections 17. The pin members 20 are arranged in the heat insulating member 16 at suitable intervals therebetween, the pin members 20 holding the heating wires 18 such that the heating wires 18 are movable in the radial direction of the heater 5, while preventing dropout of the heating wires 18 from the shelf sections 17.

Thus, the heating wires 18 of a spiral type can be easily placed in an exposed condition on the respective shelf sections 17 that are formed on the inner circumference of the heat insulating member 16. As a result, a temperature of the processing vessel 3 can be quickly increased and decreased. Meanwhile, since thermal expansion and thermal shrinkage of the heating wires 18 of a spiral type are allowed, durability of the heating wires 18 can be enhanced. Further, no additional cost is needed.

With the use of the heating wire 18 of a spiral type, a ratio of an element surface area can be effectively increased. Thus, a load (stress) in the heating wire can be relatively reduced to thereby restrain a breakage thereof. Therefore, a large power can be supplied to the heating wire 18 so as to quickly increase the temperature. Further, since disconnection (breakage) can be restrained, improvement in durability, i.e., a longer lifetime can be achieved. Furthermore, it is possible to use an inexpensive kanthal wire to form the heating wire 18, and thus reduction in cost can be achieved.

In order to improve a temperature increase/decrease speed, it is preferable to position or hold the heating wire 18 such that an inner circumferential periphery of the heat insulating member 16, which is an opening periphery of the groove 21 of the shelf section 17, and the center c of the spiral portion 18a (center of the helical pattern) are conformed (aligned) to each other when viewed in an axial direction of the heater 5. This is because, a radiation range for an object to be heated (wafer) is enlarged (exposed areas of the heater elements that can be seen from a wafer are enlarged). In addition, the shorter the vertical length of the shelf section is, the more the heat increase speed is improved, because the exposed areas of the heater elements can broaden for upper and lower wafers. In addition, the shorter the vertical length of the shelf section is, the more the heat decrease speed is improved, because a heat capacity of the heat insulating member 16 is reduced. Further, the shorter the vertical length of the shelf section is, the more the temperature decrease speed is improved, because opened areas of the heater elements are increased whereby confinement of heat can be reduced and the heater elements are more likely to receive the forcible cooling air.

Figure 8:
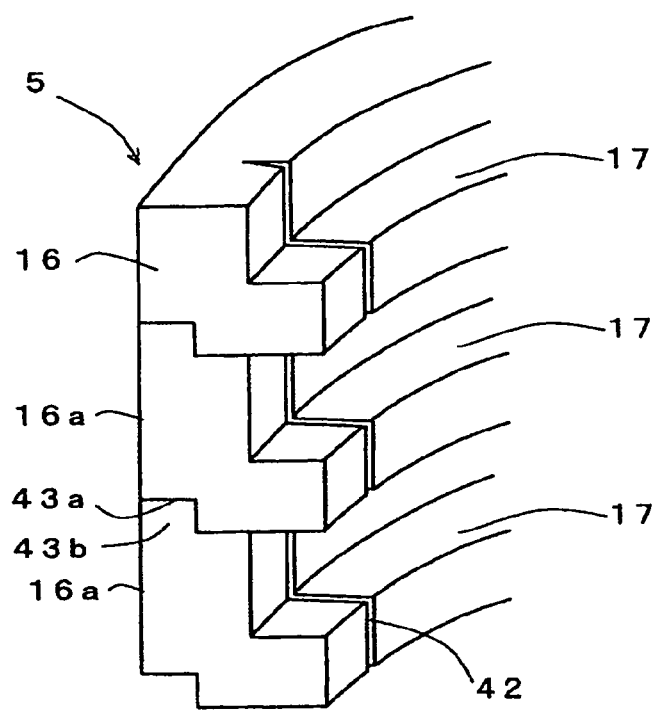
FIG. 8 is a perspective view showing another example of the heat insulating member.
Figures 9A, 9B:
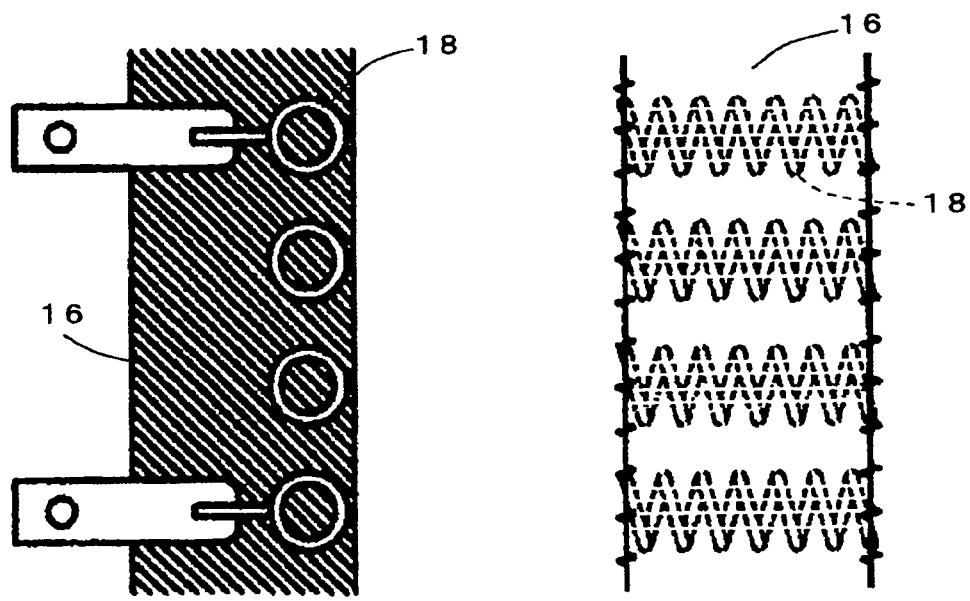
FIG. 9A is a sectional view showing an example of a conventional heater.
FIG. 9B is a schematic view showing an inner peripheral surface of the conventional heater.

FIG. 8 is a perspective view showing another example of the heat insulating member. There is a possibility that the inner surface of the heat insulating member 16 of the heater 5 suffers some cracks because of an internal stress caused by thermal expansion and thermal shrinkage of itself. In order to avoid this cracking, as shown in FIG. 8, it is preferable that a slit 42 is axially formed in the inner surface beforehand. A wire connecting portion of the heating wires may be passed through the slit 42. Further, in consideration of assemblage of the heater, the heat insulating member 16 is preferably, vertically divided at the lower surfaces of the respective shelf sections 17. Namely, it is preferable that the heat insulating member 16 is composed of a plurality of vertically divided blocks 16a. This structure facilitates placement of the heating wires 18 on the respective shelf sections 17. That is, a heating wire 18 is firstly placed on the shelf section 17 of the first divided block 16a, the second divided block 16a is then laid thereon, and a heating wire 18 is placed on the shelf section 17 of the second divided block 16a, and so forth. Thus, improvement in assemblage can be attained. In this case, it is preferable that a recess 43a and a projection 43b, which can be engaged with each other for positioning, are circumferentially formed in opposed surfaces of the divided blocks 16a that are vertically adjacent to each other. As shown in FIG. 7A, it is advantageous to form the heat insulating member 16 into the semi-circular shape, in terms of reduction in the number of parts.

The embodiments of the present invention have been described in detail with reference to the drawings. However, the present invention is not limited to the above respective embodiments, and various modifications and changes are possible without departing from the scope of the present invention. For example, connected to a lower end of the processing vessel may be a cylindrical manifold made of a heat resistive metal, such as stainless steel, having an inlet pipe part and an outlet pipe part. In addition, the processing vessel may be of a dual tube structure.

The invention claimed is:

1. A heat processing furnace comprising: a processing vessel for accommodating an object to be processed and performing thereto a heat process; and a cylindrical heater disposed to surround a circumference of the processing vessel, for heating the object to be processed, wherein the heater includes:
a cylindrical heat insulating member,
ribbed shelf sections that are axially formed in a tier-like manner on an inner circumference of the heat insulating member, and
heating resistance wires of a helical pattern that are placed along the respective shelf sections; and
pin members are arranged in the heat insulating member at suitable intervals there between, the pin members holding the heating resistance wires such that the heating resistance wires are movable in a radial direction of the heater, while preventing dropout of the heating resistance wires from the shelf sections and, wherein
each of the shelf sections of the heat insulating member is provided with a forcible-cooling-air blowing hole that passes through the shelf section inside and outside.

2. The heat processing furnace according to claim 1, wherein
each of the pin members has a U-shape in plan view to form a U-shaped portion to hold an outside turning portion of the heating wire, and
opposed leg parts of the pin member are passed through the heat insulating member from the inside to the outside, and bent along an outer surface of the heat insulating member.

3. The heat processing furnace according to claim 1, wherein
each of the heating resistance wires is positioned such that an inner periphery of the heat insulating member, which is an opening periphery of the shelf section, and a center of the helical pattern are conformed (aligned) to each other, when viewed in an axial direction of the heater.

4. A vertical-type heat processing apparatus comprising:
a heat processing furnace including an elongated processing vessel having a lower part that is opened to define a furnace opening, for accommodating an object to be processed and performing thereto a heat process; and a cylindrical heater disposed to surround a circumference of the processing vessel, for heating the object to be processed;
a lid member for closing the furnace opening; and
an elevating mechanism that elevates the lid member under a condition wherein a holder holding objects to be processed in a tier-like manner is placed on the lid, and that opens and closes the furnace opening with the lid member so as to load and unload the holder into and from the processing vessel,
wherein the heater includes:
a cylindrical heat insulating member,
ribbed shelf sections that are axially formed in a tier-like manner on an inner circumference of the heat insulating member, and
heating resistance wires of a helical pattern that are placed along the respective shelf sections;
wherein pin members are arranged in the heat insulating member at suitable intervals there between, the pin members holding the heating resistance wires such that the heating resistance wires are movable in a radial direction of the heater, while preventing dropout of the heating resistance wires from the shelf sections and,
wherein each of the shelf sections of the heat insulating member is provided with a forcible-cooling-air blowing hole that passes through the shelf section inside and outside.

5. The vertical-type heat processing apparatus according to claim 4, wherein
each of the pin members has a U-shape in plan view to form a U-shaped portion to hold an outside turning portion of the heating wire, and
opposed leg parts of the pin member are passed through the heat insulating member from the inside to the outside, and bent along an outer surface of the heat insulating member.

6. The vertical-type heat processing apparatus according to claim 4, wherein
each of the heating resistance wires is positioned such that an inner periphery of the heat insulating member, which is an opening periphery of the shelf section, and a center of the helical pattern are conformed (aligned) to each other, when viewed in an axial direction of the heater.

* * * * *